United States Patent
Nagashima et al.

[11] 3,931,600
[45] Jan. 6, 1976

[54] MECHANICAL FILTER

[75] Inventors: Toshio Nagashima; Ichiro Imaguchi; Shigeo Igarashi, all of Hamura, Japan

[73] Assignee: Kokusai Electric Co., Ltd., Tokyo, Japan

[22] Filed: May 24, 1974

[21] Appl. No.: 472,987

[30] Foreign Application Priority Data
June 11, 1973 Japan................................ 48-65589
June 11, 1973 Japan................................ 48-65591
June 11, 1973 Japan................................ 48-65590
June 15, 1973 Japan................................ 48-70837

[52] U.S. Cl. .................... 333/71; 310/8.2; 310/8.5; 333/72
[51] Int. Cl.² .................... H03H 9/02; H03H 9/26; H04R 17/00; H01L 41/04
[58] Field of Search .................... 333/30 R, 71, 72; 310/8.2–8.7

[56] References Cited
UNITED STATES PATENTS

| | | | |
|---|---|---|---|
| 2,969,511 | 1/1961 | Börner | 333/71 |
| 2,994,047 | 7/1961 | Börner | 333/72 X |
| 3,064,213 | 11/1962 | Mason | 333/72 X |
| 3,369,200 | 2/1968 | Kunemund et al. | 333/71 |
| 3,784,936 | 1/1974 | Klein et al. | 333/71 |
| 3,808,563 | 4/1974 | Börner et al. | 333/72 |

*Primary Examiner*—Archie R. Borchelt
*Assistant Examiner*—Marvin Nussbaum

[57] ABSTRACT

In a mechanical filter, a pair of transducer elements of truncated circular cross-section are disposed at the input and output sides respectively, and they are mechanically connected in cascade to each other by means of a coupler member. The areas of the truncated cross-section of the transducer elements are made different from each other. Between said pair of transducer elements may be provided one or more resonator elements each provided with a recess and connected to each other and to said transducer elements by said coupler member. Each of the transducers and resonators are mounted on a mount base plate by means of a bent wire-like support member having a pair of legs. The foregoing mechanical filter is accommodated in a container which is pressure-reduced and hermetically sealed.

14 Claims, 25 Drawing Figures

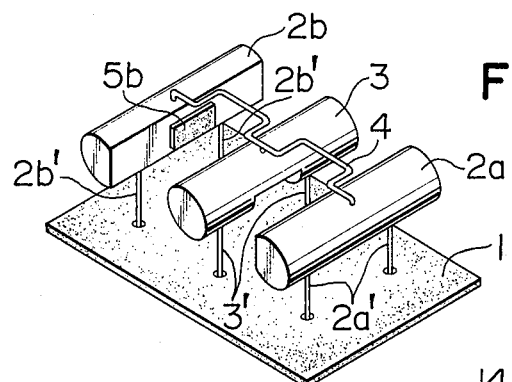
FIG. 7
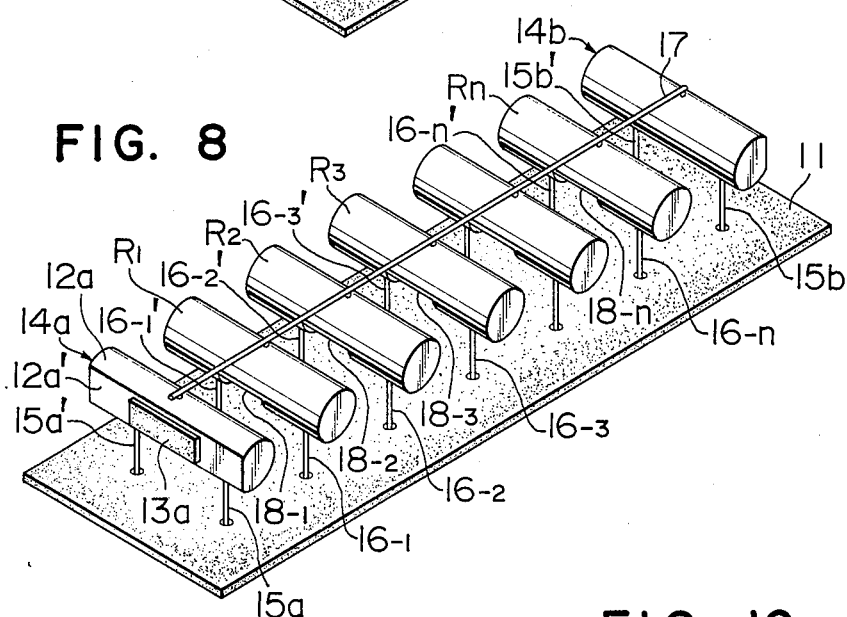
FIG. 8
FIG. 9A   FIG. 9B
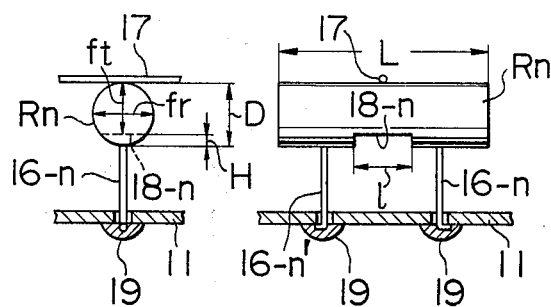
FIG. 10
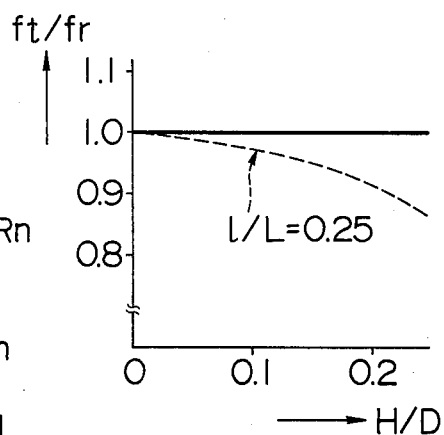

MECHANICAL FILTER

This invention relates to a mechanical filter of the type which comprises a pair of electromechanical transducer elements and a coupling member connecting said transducer elements, wherein one or more mechanical resonator elements may be provided between said transducer elements and connected to each other and to said transducer elements through said coupling member. Furthermore, this invention relates to a container for such a filter. Still furthermore, this invention relates to a support mechanism for each of said elements.

Various mechanical filters have heretofore been proposed and the resonator elements used therewith have been in various forms. For example, in a mechanical filter wherein a coupler is inserted through apertures formed at the nodal points of resonator elements whereby the latters are twist-coupled together, rod-like members of square or rectangular cross-section have been used as the resonator elements because of their advantage of increased machining precision. However, in a mechanical filter of the type wherein a coupler is spot-welded or otherwise secured to the surfaces of resonator elements and these resonator elements are cascade-connected by longitudinal mode coupling or by flexural mode coupling, the use of rod-like members square or rectangular in cross-section as the resonator elements would prevent the coupler from being secured to the predetermined points of the resonator elements because the coupling points of the coupler to the resonator elements lie on the flat surfaces of the resonator elements, the result of which would be equivalent to an irregularity produced in the constant of the coupler, thus failing to provide a desired transmission characteristic. In order to avoid such problem, it is known to use round-rod like resonator elements in lieu of the square or rectangular rod-like elements such as described above. However, this would offer a new problem that when the round rod-like resonator elements effect bending resonance, a number of resonance frequencies present diametrically thereof will appear in the form of spurious resonance.

On the other hand, the use of flexural mode resonator elements as the mechanical resonator elements forming a mechanical filter is known to be advantageous in reducing the size and weight of the filter. The natural resonance frequency of a flexural mode resonator may freely be set to any desired value by suitably selecting the cross-sectional shape and length of the resonator, whereas there are problems as to the machining precision, the supporting precision and the like which greatly affect the characteristic of the resultant filter.

Thus, where the machining precision should be taken into consideration, the use of round rod-like resonators would be advantageous because of their easier tooling, improved precision, reduced machining cost, etc. Nevertheless, if such round rod-like resonators are directly used for the mechanical filter and a coupler and support wires are attached to these resonators, the mass of the coupler and of the support wires would result in production of resonances in a direction perpendicular to the direction of resonance of the resonators, i.e. spurious resonances whose frequencies are so close to the frequency of the working resonance as would deteriorate the transmission characteristic of the filter.

In the mechanical filter of the described type wherein a coupler is mechanically coupled to resonators and the opposite ends of the coupler are connected to electromechanical transducer elements, the resonance mode of the resonators including the transducer elements and of the coupler can freely be selected but will necessarily be limited by the requirements of the equipments to which the filter is applied. Particularly, where the size reduction is required, the use of flexural (bending) resonators would be advantageous while the resonance mode of the coupler is often determined by the specific band width of the filter characteristic required, and more specifically, longitudinal mode resonance is generally preferred for a wide band type and twist or flexural mode resonance is preferred for a narrow band type. However, the flexural mode resonator, as will be seen from its resonance mode, has its resonance readily restricted by the resistance and resonance of the ambient air. More particularly, where a plurality of flexural mode resonators are disposed in closely spaced, parallel relationship, resonance of one of the resonators will propagate through the air (air-resonance) to affect the resonance in other resonators. Also, where resonators are contained within a single casing, sound wave produced by each resonator will be reflected by the inner walls of the casing to affect the resonance of that resonator itself and of other resonators, thus deteriorating the frequency characteristic of the filter. In case of the other mode resonances than the flexural mode resonance, for example, in case of longitudinal mode resonance, there is not so marked influence but problems may occur depending on the standard of characteristic required. To avoid this, it has heretofore been proposed that some acoustic material or irregular reflection material be inserted in the casing, whereas it has been found that such method cannot ensure reliable operation.

Further, where an resonator of the bending resonance type is employed for a resonator, its mechanical and electrical characteristics are governed by the manner in which the resonator is mechanically supported with respect to the resonator. Therefore, this must be sufficiently taken into account. The heretofore most popular supporting method for straight, planar resonator has comprised the steps of forming apertures in the resonator at the nodal points thereof, securing the upper ends of metal support rods to such apertures by threading or soldering and securing the lower ends of the support rods to a mount base plate. Thus, such method has involved cumbersome procedures during manufacture and incurred a high machining cost.

It is therefore an object of the present invention to provide a novel and improved mechanical filter which employs round rod-like mechanical resonators and which is provided with means for spacing the above-mentioned spurious resonance frequencies away from the working frequency and for preventing matching between the spurous resonance frequencies produced by the respective mechanical resonators to thereby avoid the aforementioned deterioration of the transmission characteristic and the adverse effect imparted by the spurious resonances.

It is another object of the present invention to provide an improved mechanical filter in which the aforementioned spurious resonances may be separated far away from the working frequency to improve the transmission characteristic. According to the present invention, a recess is formed in the center portion (loop portion) of a round rod-like resonator whereby the resonance frequencies perpendicular to the direction of resonance of the resonator may be detuned out of the filter band. In addition, the present invention ensures the resonator to attain the required machining precision and also permits mass production to be carried out with a reduced machining cost.

It is a further object of the present invention to provide a container for mechanical filter in which the internal pressure is reduced to prevent propagation in the air of sound waves to thereby prevent deterioration of the filter characteristic which would otherwise result from the sound waves being reflected by the inner walls of the container, and particularly, such a container which permits such pressure-reduction to be achieved simply and reliably and enables effective hermetic sealing to be realized.

It is still a further object of the present invention to provide a support mechanism for bending mode resonator which does not reduce the mechanical and electrical performances of the resonator and which is easy to manufacture and suited for mass production.

Other objects, advantages and features of the present invention will become apparent from the following detailed description taken in conjunction with the accompanying drawings.

Figure 1:
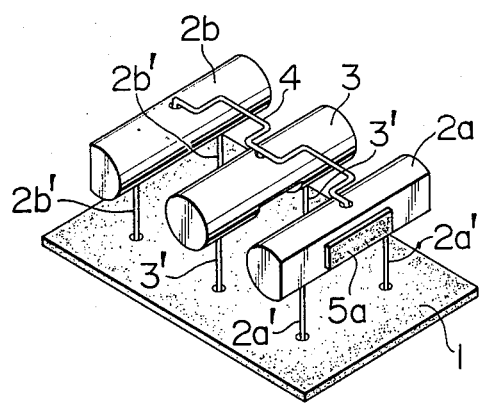
FIG. 1 is a schematic perspective view of the mechanical filter according to a first embodiment of the present invention.
Figure 3A:
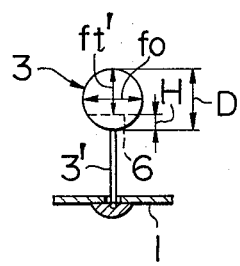

FIGS. 3A and B are an end view and a side view, respectively, of a mechanical resonator usable in the embodiment of FIG. 1.

Figure 4:
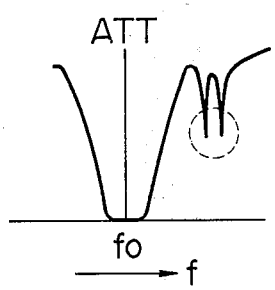
Figure 5:
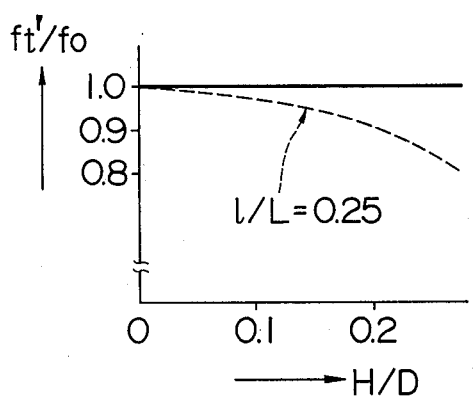
Figure 6:
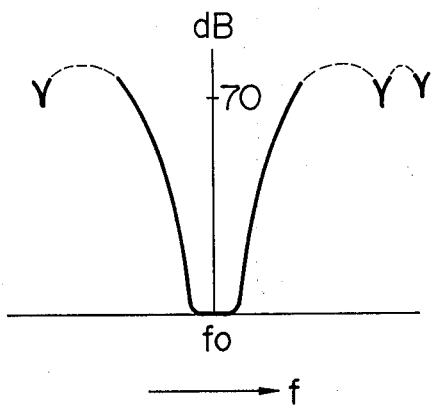

FIGS. 4, 5 and 6 are graphs useful to illustrate the embodiment of FIG. 1.

FIG. 7 is a view similar to FIG. 1 but showing a modification to the mechanical filter shown in FIG. 1.

FIG. 8 is a schematic perspective view of the mechanical filter according to a second embodiment of the present invention.

FIGS. 9A and B are an end view and a side view, respectively, of a mechanical resonator usable with the embodiment of FIG. 8.

Figure 11:
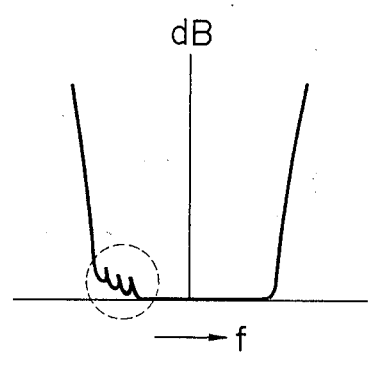
Figure 12:
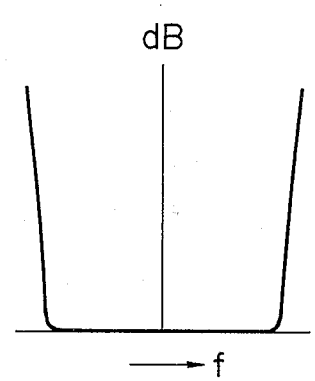

FIGS. 10, 11 and 12 are graphs useful to illustrate the embodiment of FIG. 8.

Figure 13:
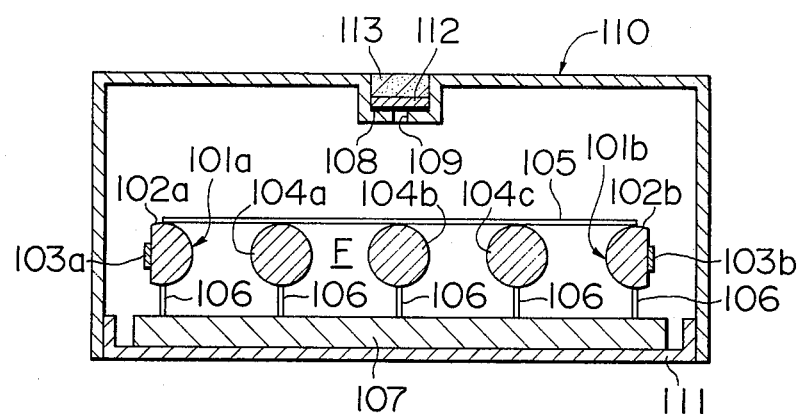

FIG. 13 is a schematic cross-sectional view of the container according to a further embodiment of the present invention and also showing the mechanical filter contained therein.

Figure 14:
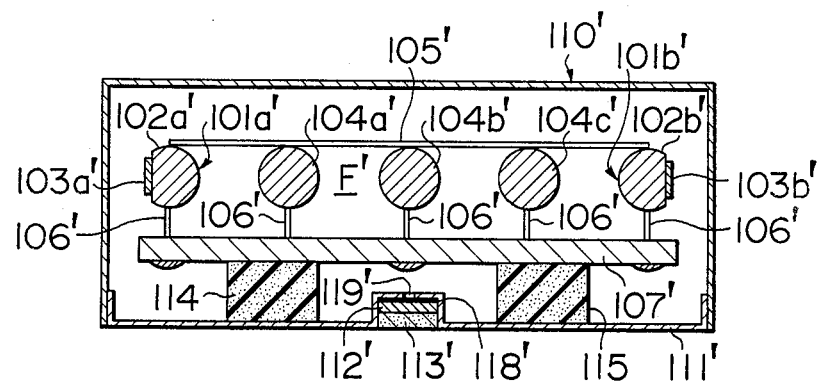

FIG. 14 is a view similar to FIG. 13 but showing a modification to the FIG. 13 embodiment.

Figure 15:
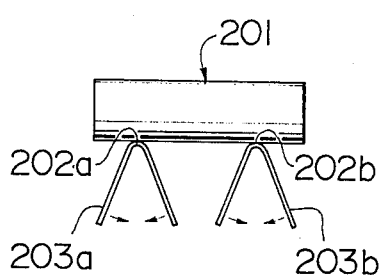

FIG. 15 is a side view for illustrating a step in the method of forming the support mechanism according to still a further embodiment of the present invention.

Figure 16:
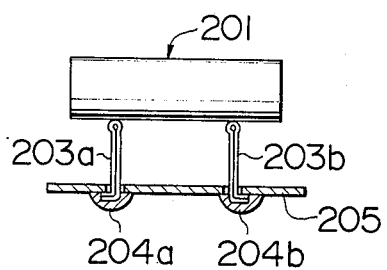

FIG. 16 is a side view showing the support mechanism constructed by the method of FIG. 15.

Figure 17:
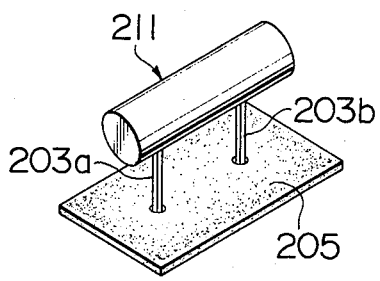

FIG. 17 is a schematic perspective view showing an application of the inventive support mechanism of FIGS. 15 and 16 to a round rod-like bending mode resonator.

Figures 18A, 18B:
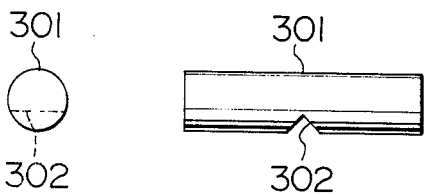

FIGS. 18A and B, 19A and B, and 20A and B are end views and side views, respectively, of further forms of the mechanical resonator according to the present invention.

FIG. 1 is a schematic perspective view of the mechanical filter according to an embodiment of the present invention. In this embodiment, a mount base plate 1 mounts thereon an input side electromechanical transducer 2a and an output side electromechanical transducer 2b by means of fixtures 2a' and 2b', respectively, the two transducers being disposed in substantially parallel, spaced relationship with each other. A mechanical resonator 3 is likewise mounted on the base plate 1 between the electromechanical transducers 2a and 2b, by means of fixtures 3'. Although only one mechanical resonator 3 is shown for the purpose of illustration, it will be apparent that more than one such resonator 3 may be disposed in substantially parallel, spaced relationship, if desired. Alternatively, such resonator may entirely be eliminated.

The input and output side electro-mechanical transducers 2a and 2b and the mechanical resonator 3 are mechanically cascade-connected by a coupler 4 capable of flexural resonance. A piezo-electric ceramic plate 5a is secured to the flattened surface of the input side electro-mechanical transducer 2a. A similar piezoelectric ceramic plate 5b is secured to the flattened surface of the output side electromechanical transducer 2b, and although not shown, input and output terminals are led out from these piezoelectric ceramic plates, respectively. In the present embodiment, the transducers 2a and 2b are shown to be opposed to each other with their flattened surfaces facing outwardly, whereas they may also be disposed with their flattened surfaces facing inwardly, as shown in FIG. 7.

Figure 2:
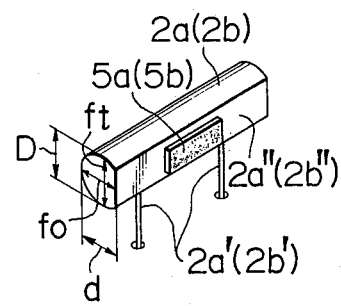
FIG. 2 is a schematic perspective view showing an electro-mechanical transducer used with the mechanical filter of FIG. 1.

Referring to FIG. 2, it particularly shows the electromechanical transducer 2a or 2b according to the present invention. This element is formed as a round rod-like member of generally truncated circular cross-section having a flattened surface 2a'' or 2b'', and the above-described piezoelectric ceramic plate 5a or 5b is secured to the flattened surface 2a'' or 2b''.

Figure 3B:
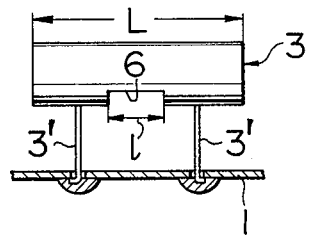

Referring now to FIG. 3, it particularly shows the mechanical resonator 3 according to the present invention, which resonator comprises a metal rod-like member of generally circular cross-section and has an axially extending recess 6 formed in the underside thereof. It should particularly be noted that this recess 6 functions to detune spurious resonance frequencies from the working frequency.

In the above-described construction, where the number of the mechanical resonators 3 disposed between the input and output side transducers 2a and 2b is as small as zero to three, it has been found that even when a spruious frequency $f_t'$ is detuned by using the transducer 2a or 2b of such truncated circular cross-section as described, there is unavoidably produced a spurious resonance as indicated by a phantom circle in FIG. 4.

As a result of various experiments and studies carried out to find out the cause, the inventors have ascertained that such spurious resonance occurs when the ratio of d to D in FIG. 2, i.e. d/D, is equal between the input and output side electromechanical transducer and that by providing different values of such ratio for the two elements, production of such spurious resonance can be completely avoided. Thus, according to the present invention, the d/D of the electro-mechanical transducer is made to differ between the input side and the output side. In other words, the area of the truncated circular cross-section of the element differs from the input side to the output side.

In the present embodiment, the mechanical resonator 3 is formed with the recess 6 to detune the spurious frequencies of the resonator. Let the length and diameter of the resonator be L and D, respectively, and let the length and depth of the recess 6 be l and H, respectively. Then, the relationship between the conditions of the recess 6 and the ratio of the spurious frequency $f_t'$ to the working frequency $f_0$ has proved to be such as shown in FIG. 5. FIG. 6 illustrates the tendency of the transmission characteristic realized by the construction of the present invention, with the abscissa representing the frequency and the ordinate representing the amount of attenuation in dB. It will thus be apparent that the present invention can avoid production of spurious frequencies and realize an excellent transmission characteristic.

FIG. 8 is a schematic perspective view showing a mechanical filter according to another embodiment of the present invention. In this embodiment, a mount base plate 11 such as a printed base plate mounts thereon an input side electro-mechanical transducer 14a comprising a resonator 12a of generally truncated circular cross-section capable of flexural made resonance and a piezoelectric ceramic plate 13a secured to the flattened surface 12a' of the resonator, and an output side electro-mechanical transducer 14b of similar construction, by means of perpective pairs of support wires 15a, 15a' and 15b, 15b', in such a manner that the two transducers 14a and 14b are in parallel, spaced relationship with each other. Disposed between these transducers are parallel, spaced, round rod-like, mechanical resonators $R_1$ to $R_n$ capable of flexural mode resonance and mounted on the base plate 11 by respective bent wires having a pair of legs 16-1 and 16-1', . . ., 16-n and 16-n' respectively, in the same manner as described for the transducers. A coupler 17, capable of longitudinal resonance, extends on and perpendicularly to the axes of the transducers 14a, 14b and the resonators $R_1$ to $R_n$ in the loop portion of the resonator, and is secured thereto as by spot-welding.

FIGS. 9A and B are an end view and a side view, respectively, showing the mechanical resonator $R_n$ of the present invention and the manner in which it is mounted with respect to the base plate 11. It is seen in these figures that the resonators $R_1$ to $R_n$ have recesses 18-1 to 18-n formed in the loop portion thereof on the side opposite to that side at which the coupler is secured, these recesses facing the top surface of the base plate 11. Further, the support wires 15a and 15a', 15b and 15b', 16-1 and 16-1', . . ., 16-n and 16-n' are located at the nodal points on the side opposite to that side at which the coupler 17 is secured, and are secured to the base plate 11 by means of securing material such as solder or the like, in the manner as shown in FIG. 9.

The working frequency which determines the characteristic of the mechanical filter is in the direction as indicated by $f_r$ in FIG. 9A, i.e. the lateral direction, and the resonance in the direction of $f_t$ perpendicular thereto provides spurious resonance. In this instance, the recess formed in each of the resonators acts as a minute mass reduction with respect to the direction of $f_t$ and as a variation in the cross-sectional configuration with respect to the direction of $f_r$, and thus produces a great reduction in the frequency on the same principle as the so-called stepped bar resonator, whereby there is established the relation that $f_r > f_t$. Where the length and diameter of each mechanical resonator $R_1, \ldots, R_n$ are L and D, respectively, and the length and depth of each recess 18-1, . . ., 18-n are l and H, respectively, FIG. 10 illustrates the relation between $f_r$ and $f_t$ with respect to the configuration of the recess.

FIG. 11 illustrates the tendency of the transmission characteristic of the filter employing mechanical resonators formed with no such recess as described above, with the abscissa representing the frequency and the ordinate representing the attenuation amount of dB. In this instance, spurious resonance often tends to occur to the frequency $f_t$ as indicated within a phantom circle. However, if each mechanical resonator is formed with a recess in accordance with the present invention, the spurious resonance $f_t$ is expelled out of the lower band of the filter so that the transmission characteristic is improved as illustrated in FIG. 12. The spurious resonance expelled out of the band may be suppressed by the input and output side electro-mechanical transducers 14a, 14b and matching circuit, not shown. If the recess is formed laterally with respect to the axis of the mechanical resonator, the spurious resonance may be expelled out of the upper band of the filter to provide the same effect as described above, but in this case, if the band width of the filter is wide, the dimensions of the recess would have to be larger and this would lead to disadvantages in machining precision, machining cost, etc.

Referring to FIG. 13, an embodiment of the mechanical filter container according to the present invention is shown in connection with the manner in which its pressure-reduction and hermetic sealing is effected. In FIG. 13, the container accommodater an example of mechanical filter wherein there are provided input and output side electro-mechanical transducers 101a and 101b which respectively comprise resonators 102a and 102b of truncated circular crosssection capable of flexural mode resonance and piezoelectric ceramic plates 103a and 103b attached thereto. Disposed between these transducers 101a and 101b are round rod-like flexural mode resonators 104a, 104b and 104c. The transducers and the resonators are mechanically cascade-connected by a coupler 105. The electro-mechanical transducers 101a, 101b and the resonators 104a, 104b, 104c are mounted on a mount base plate 107 such as printed base plate by means of support wires 106. A mechanical filter thus formed by the above-described components is generally designated by F.

In this embodiment, an open-bottomed box-like member 110 is prepared which has a recess 108 formed in the top wall and provided with a through-aperture 109, and the box-like member 110 is hermetically fitted to the bottom wall 111 to which is adhesively or otherwise secured the base plate 107 having the above-described mechanical filter F mounted thereon. A sheet 112, for example, of one-side or both-side adhesive vinyl tape, is attached to the recess 108 so as to cover the through-aperture 109.

The box-like member 110 now with the mechanical filter F contained therein is disposed within a pressure-reducing kiln (not shown) connected to a vacuum pump through a cock or like opening-closing means, and then the pressure in the kiln is reduced to a predetermined value by the vacuum pump. This causes the air within the box-like member 110 to be drawn from the aperture 109 through a clearance between the sheet 112 and the surface of the recess in the box 110, so that the internal pressure of the box 110 assumes the same level as that within the kiln. When the cock is opened to momentarily admit the air into the kiln, the pressure of such air urges the sheet 112 into contact with the surface of the recess 108 in the box, thus providing complete sealing of the aperture 109. To provide and maintain further complete sealing of the aperture, a sealing material 113 such as silicone, epoxy or the like may be introduced into the recess 108 from above the sheet 112. Since the through-aperture is formed through the bottom of the recess 108 and such recess is filled with the sealing material 113, it may be avoided that the sealing material bulges outwardly of the major top surface of the box 110 to increase the outside dimensions of that portion. Thus, the pressure reduction and hermetic sealing of the mechanical filter may be achieved by a simple construction, whereby deterioration of the filter characteristic may be effectively prevented.

FIG. 14 shows a modification of the FIG. 13 embodiment. It is similar to the embodiment of FIG. 13 except that a recess 118′ is formed in the bottom wall 111′ of a box 110′ and that a base plate 107′ rests on a pair of support members 114 and 115 on the bottom wall 111′, which support members may be formed of a shock-absorbing material such as rubber, sponge or the like.

Referring now to FIGS. 15 to 17, there is shown an embodiment of the support mechanism for the resonator according to the present invention. In this embodiment, metal wires 203a, and 203b are spot-welded at the center thereof to a bending mode resonator 201 at its nodal points 202a and 202b, and then the metal wires 203a and 203b are bent about their spot-welded points in such directions that the bent portions of each wire come toward each other, i.e. in the directions as indicated by opposed arrows in FIG. 15, until the bent portions become substantially perpendicular to the axis of the resonator 201 and come into intimate contact with each other so as to form a pine-needle configuration, whereafter the free ends of the metal wires 203a and 203b are secured to a mount base plate 205 such as printed base plate, in the manner as indicated at 204a and 204b in FIG. 16.

FIG. 17 shows an application of the present invention to a round rod-like bending mode resonator 211.

Thus, in accordance with the present invention, the necessity of forming apertures at the nodal points of the bending mode resonator and the cumbersome precedures of threading or soldering may all be eliminated and the only step required is simply to have the support metal wires spot-welded to the resonator and to bend such wires in the manner described above. This permits low cost of the manufacture and is suitable for mass production, and in addition, the resultant support mechanism does not reduce the mechanical and electrical characteristics of the filter or other devices to which the support mechanism is applied.

Figures 19A, 19B:
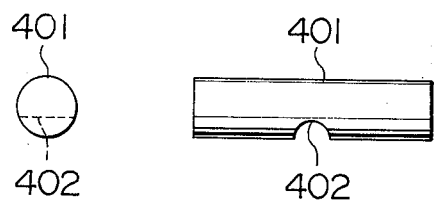
Figures 20A, 20B:
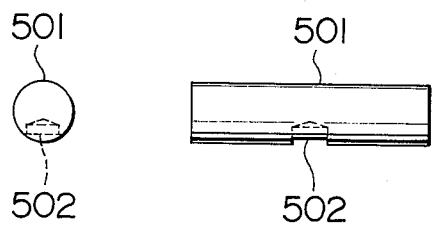

FIGS. 18A and B to FIGS. 20A and B show, in end view and side view, respectively, further embodiments of the mechanical resonator according to the present invention. The resonator 301 of FIG. 18A and B is formed with a recess 302 whose cross-sectional shape in a plane parallel to the longitudinal axis thereof is triangular. The resonator 401 of FIGS. 19A and B is formed with a recess 402 whose cross-sectional shape in a plane parallel to the longitudinal axis thereof is semi-circular. The resonator 501 of FIGS. 20A and B is formed with a recess 502 comprising a combination of a recess whose cross-sectional shape in a plane parallel to the longitudinal axis of the resonator is square, and an upper pyramid-shaped recess contiguous to the square recess. Any of these resonators has provded to be suitable for application to the mechanical filter of the present invention.

While the invention has been shown and described with respect to some specific embodiments, it should be understood that the invention is not restricted to such embodiments but includes all changes and modifications which will fall within the spirit and scope of the invention as defined in the appended claims.

What is claimed is:

1. A mechanical filter comprising an input electro-mechanical transducer element and an output electro-mechanical transducer element, each of truncated circular cross-section and disposed in predetermined, substantially parallel, spaced relationship, and a coupler element, having a flexural or longitudinal mode resonance characteristic, mechanically cascade-connecting the electro-mechanical transducer elements, wherein the ratio of $d$ to D of the input electro-mechanical transducer element is made to differ from that of the output electro-mechanical transducer element, where $d$ represents the maximum width in the direction perpendicular to the truncated edge of each of said transducer elements and D indicates the maximum width in the direction parallel to the truncated edge of each of said transducer elements.

2. A mechanical filter according to claim 1, further comprising one or more resonator elements of circular cross-section disposed between said electro-mechanical transducer elements and in predetermined spaced relationship to each other and to said transducer elements, said resonator elements being formed with a recess and connected to each other and to said transducer elements through said coupler element.

3. A mechanical filter according to claim 2, wherein the cross-sectional shape of said recess taken in a plane parallel to the longitudinal axis of said resonator is square.

4. A mechanical filter according to claim 2, wherein the cross-sectional shape of said recess taken in a plane parallel to the longitudinal axis of said resonator is triangular.

5. A mechanical filter according to claim 2, wherein the cross-sectional shape of said recess taken in a plane parallel to the longitudinal axis of said resonator is semi-circular.

6. A mechanical filter according to claim 2, wherein said recess comprises a combination of a recess whose cross-sectional shape taken in a plane parallel to the longitudinal axis of said resonator is square, and an upper pyramid-shaped recess contiguous to said square recess.

7. A mechanical filter according to claim 2, wherein the cross-sectional shape of said recess taken in a plane parallel to the longitudinal axis of said resonator is rectangular.

8. A mechanical filter according to claim 2, wherein said recess comprises a combination of a recess whose cross-sectional shape taken in a plane parallel to the longitudinal axis of said resonator is rectangular, and an upper pyramid-shaped recess contiguous to said rectangular recess.

9. A mechanical filter comprising an input side and an output side electro-mechanical transducer element parallel to each other, each of said transducer elements comprising a resonator of truncated circular cross-sectional capable of flexural mode resonance, each of said transducer elements having a piezoelectric ceramic member attached thereto, at least one round rod-like flexural mode resonator disposed between said electromechanical transducer elements and in a predetermined parallel, spaced relationship, and a coupler of longitudinal mode resonance property extending on and perpendicularly to the axes of said electro-mechanical transducer elements and said flexural mode resonator and secured thereto, said flexural mode resonator having a recess formed in the loop portion thereof opposed to said coupler secured to said flexural mode resonator, each of said electro-mechanical transducer elements and said flexural mode resonator being mounted on a mount base plate by means of a bent wire-like support member having a pair of legs, at the nodal points on the side opposite to that side at which said coupler is secured.

10. A mechanical filter according to claim 9, wherein the cross-sectional shape of said recess taken in a plane parallel to the longitudinal axis of said resonator is square or rectangular.

11. A mechanical filter according to claim 9, wherein the cross-sectional shape of said recess taken in a plane parallel to the longitudinal axis of said resonator is triangular.

12. A mechanical filter according to claim 9, wherein the cross-sectional shape of said recess taken in a plane parallel to the longitudinal axis of said resonator is semi-circular.

13. A mechanical filter according to claim 9, wherein said recess comprises a combination of a recess whose cross-sectional shape taken in a plane parallel to the longitudinal axis of said resonator is square rectangular, and an upper pyramid-shaped recess contiguous to said square recess.

14. A mechanism for supporting a bending mode resonator for mechanical filter comprising support metal wires spot-welded substantially centrally thereof to said resonator at the nodal points thereof, each of said support metal wires being bent about said spot-welded point so as to be substantially perpendicular to the axis of said resonator, the free ends of said metal wires so bent being secured to a support base plate.

* * * * *